United States Patent
Bewley et al.

(10) Patent No.: US 6,734,043 B2
(45) Date of Patent: May 11, 2004

(54) PRESSURE-BONDED HEAT SINK METHOD

(75) Inventors: William W. Bewley, Falls Church, VA (US); Edward A. Aifer, Arlington, VA (US); Christopher L. Felix, Washington, DC (US); Igor Vurgaftman, Pikesville, MD (US); Jerry R Meyer, Catonsville, MD (US); John Glesener, Richardson, TX (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/196,147

(22) Filed: Jul. 17, 2002

(65) Prior Publication Data

US 2002/0182779 A1 Dec. 5, 2002

Related U.S. Application Data

(62) Division of application No. 09/492,068, filed on Jan. 27, 2000, now Pat. No. 6,448,642.

(51) Int. Cl.[7] .......................... H01L 23/36; H01L 23/40
(52) U.S. Cl. ................................... 438/122; 438/26
(58) Field of Search ................ 351/36; 257/13, 257/79–103, 706, 707, 712–722; 438/22–47, 51, 55, 64, 122, FOR 413

(56) References Cited

U.S. PATENT DOCUMENTS

| | | | | |
|---|---|---|---|---|
| 3,855,546 A | * | 12/1974 | Carr | 372/44 |
| 4,203,129 A | * | 5/1980 | Oktay et al. | 257/713 |
| 4,730,459 A | * | 3/1988 | Schlicklin et al. | 62/3.7 |
| 5,463,978 A | * | 11/1995 | Larkin et al. | 117/89 |
| 5,745,623 A | * | 4/1998 | Ohtomo et al. | 385/88 |
| 5,926,369 A | * | 7/1999 | Ingraham et al. | 361/699 |

OTHER PUBLICATIONS

Jaeger. vol. V: Introduction to Microelectronic Fabrication, 1988. Addison–Wesley Publishing Company. Reading. Massachusetts. pp. 79.*

Harper. Electronic Packaging and Interconnection Handbook. 1991. McGraw–Hill. Inc. New York. pp. 2–10–2.12.*

* cited by examiner

*Primary Examiner*—Long Pham
*Assistant Examiner*—Marcos D. Pizzaro-Crespo
(74) *Attorney, Agent, or Firm*—John J. Karasek; George A. Kap (57) ABSTRACT

This invention pertains to a method for removing heat from a heat source device and to a heat sink system characterized by a pressure bond having thermal resistance of less than about 5 K/kW-cm$^2$. The method is characterized by the steps of removing heat from a heat source device comprising the steps of placing a heat source device in contact with a heat source and applying a sufficient force to form a pressure bond between the heat source device and the heat sink wherein thermal resistance at the interface between the heat source device and the heat sink after the thermal bond is established is less than about 5 K/kW-cm$^2$. The heat sink system includes a heat source device and a heat sink in contact with the heat source device with thermal resistance at the interface of the heat source device and said heat sink is less than about 5 K/kW-cm$^2$.

14 Claims, 6 Drawing Sheets

PRESSURE-BONDED HEAT SINK METHOD

This application is a divisional of application Ser. No. 09/492,068, filed on Jan. 27, 2000, now U.S. Pat. No. 6,448,642.

BACKGROUND OF THE INVENTION

1. Field of the Invention

This invention pertains to the field of heat sink using a pressure bond between a heat source device and a heat sink.

2. Description of Prior Art

There is a rapidly increasing demand for efficient IR semiconductor lasers operating at ambient or thermoelectric cooler temperatures. Military needs include countermeasures and communications whereas commercial applications focus on remote chemical sensing and drug monitoring, leak detection, chemical process control, and laser surgery. In both of these markets continuous wave (CW) or quasi-CW laser operation is essential and current thermal management techniques are the primary impediment to these types of operation.

Thermal management involves removing heat from a device which, in the case of lasers, critically affects the efficiency and maximum operating temperature. As a semiconductor laser is either electrically or optically excited, excess thermal energy from joule heating, optical heating, hot-carrier relaxation, etc., must be efficiently removed from the laser's active region to minimize degradation of the laser's performance at elevated temperatures. Standard techniques to accomplish this involve soldering the laser to a heat sink using one of a variety of soldering alloys. The heat sink is usually a high thermal conductivity material such as diamond or copper.

A typical semiconductor laser structure consists of a few microns of epitaxially grown laser material (epitaxial-side) containing the active region disposed on a lattice matched substrate. The substrate can be conveniently thinned to a minimum of about 50 microns. Two configurations for soldering a laser to a heat sink are epitaxial-side-up and epitaxial-side-down. Since most of the heat is generated in the active portion of the epitaxial layer, the heat removal is most efficient when the epitaxial layer directly contacts the heat sink, i.e., epitaxial-side-down. While this configuration is the best thermally, it is technically more complicated than the epitaxial-side-up technique and methods must be employed to insure that the facets of the laser are not obscured or contaminated by the solder or its residue. Even when voids, granularity and/or other imperfections in the solder joint do not significantly impede the heat flow, the intrinsic thermal resistance of a solder layer can be significant.

All of the soldering techniques employed for electrically-pumped semiconductor lasers may be used to fabricate optically-pumped lasers as well. A further difficulty occurs when the laser is soldered epitaxial-side-down, in that the only access by the pump laser is through the substrate. This requires that the substrate be transparent to the pump laser, which is often impractical due to other constraints related to fabrication and convenience.

Most of the currently-used soldering and mounting techniques require considerable device processing. The semiconductor and heat sink are typically patterned with layers of different metals and the soldering must be done in a highly controlled environment. Some common problems encountered in epitaxial-side-down soldering are degradation of the laser due to stress or high-temperature processing, breaking upon thermal cycling, contamination of the laser facets, and poor yield associated with the critical nature of the alignment between the laser facet and the edge of the heat sink.

Although the above discussion focused on the IR semiconductor laser application, it should be understood, however, that similar considerations apply equally to semiconductor lasers emitting in other wavelength ranges and to many other optical and electronic devices for which thermal management issues are important, including nonlinear difference frequency generation and high-power electronic devices.

OBJECTS AND SUMMARY OF THE INVENTION

An object of this invention is removal of heat from a heat source device more efficiently.

Another object of this invention is heat removal from a device by means of a pressure bond between a heat source device which generates or contains heat and a heat sink in absence of a solder joint therebetween.

Another object of this invention is more efficient heat removal from a heat source device which results in higher energy output and operation of the device at a higher temperature.

Another object of this invention is a heat sink system characterized by a pressure bond between a heat sink and a heat source device wherein heat is removed quickly and more effectively.

These and other objects of this invention are achieved by forming a pressure bond at the interface of a heat sink and a heat source device which interface has a low thermal resistance.

DETAILED DESCRIPTION OF THE INVENTION

This invention pertains to a heat sink method and to a heat sink system characterized by a pressure bond between a heat source device and a heat sink.

By the term "heat source device" is meant any optical, electronic, or optoelectronic device which requires cooling because the functioning part or some other part of the device is at a higher temperature than the heat sink temperature under some or all operating conditions.

Figure 1:
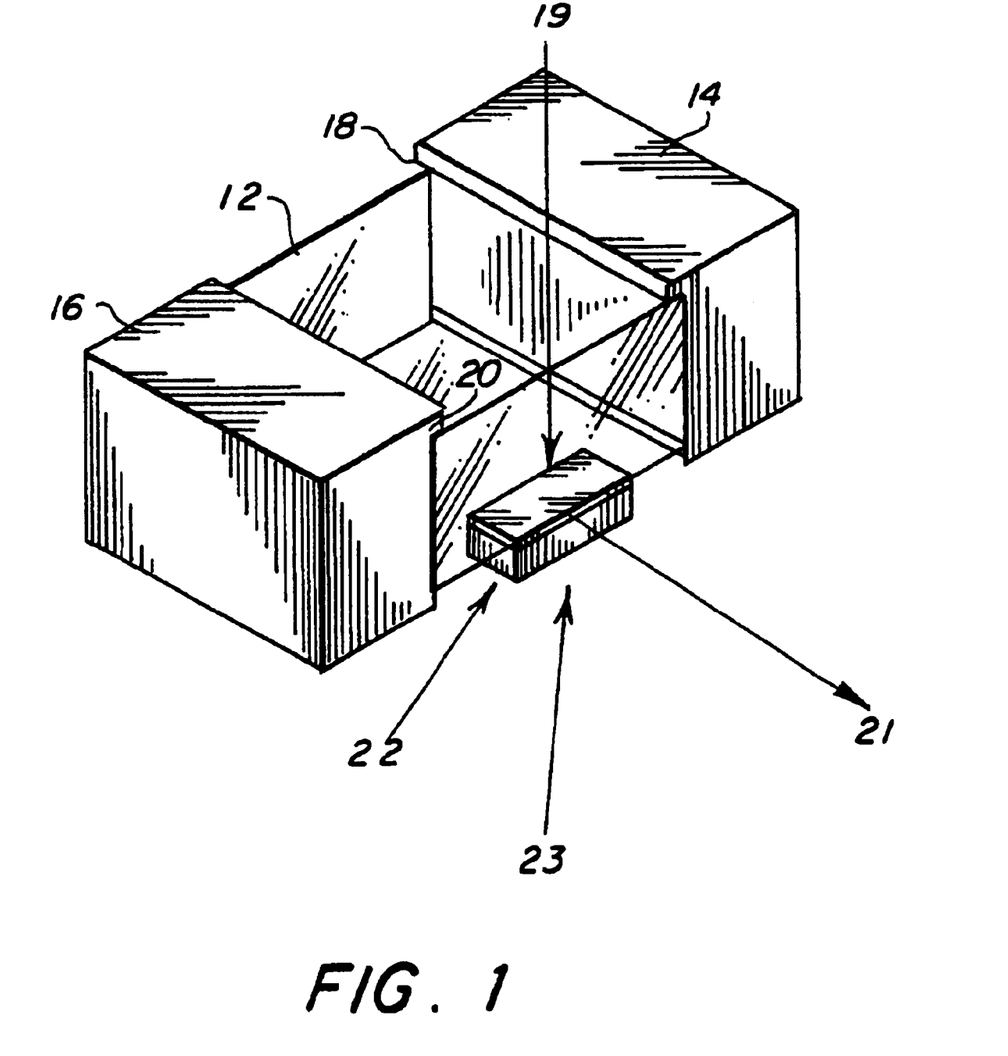
FIG. 1 is the schematic of an optically pumped semiconducting laser mounted with the epitaxially grown layer in contact with a diamond heat sink and pumped through the heat sink.

The gist of the invention herein can be gained by reference to FIG. 1 which generally depicts the essential components of the invention herein. Referring to FIG. 1, the components of the invention include principal heat sink block 12 disposed between a pair of auxiliary heat sink opposing metal blocks 14,16 with a shoulder 18 on block 14 and a shoulder 20 on block 16. The shoulders 18,20 are provided at the upper inner extremities of blocks 14,16 and are intended to locate heat sink block 12 securely between metal blocks 14,16. Heat sink block 12 is typically diamond and has dimensions on the order of 2.5 mm×2.5 mm.×1.5 mm when the heat source device 22 is a laser, pumping of which can be through the diamond heat sink 12, as shown by arrow 19, and output of which can be obtained laterally, as shown by arrow 21. Pressure needed for the pressure bond can be applied in the manner indicated by arrow 23. Dimensions of metal blocks 14,16, shown in FIG. 1, are proportional to heat sink block 12. The heat source device 22 is secured through a pressure bond to heat sink 12, as shown in FIG. 1. A cooling source, not shown, is associated with heat sinks 12, 14, 16 to provide cooling energy thereto.

Figure 2:
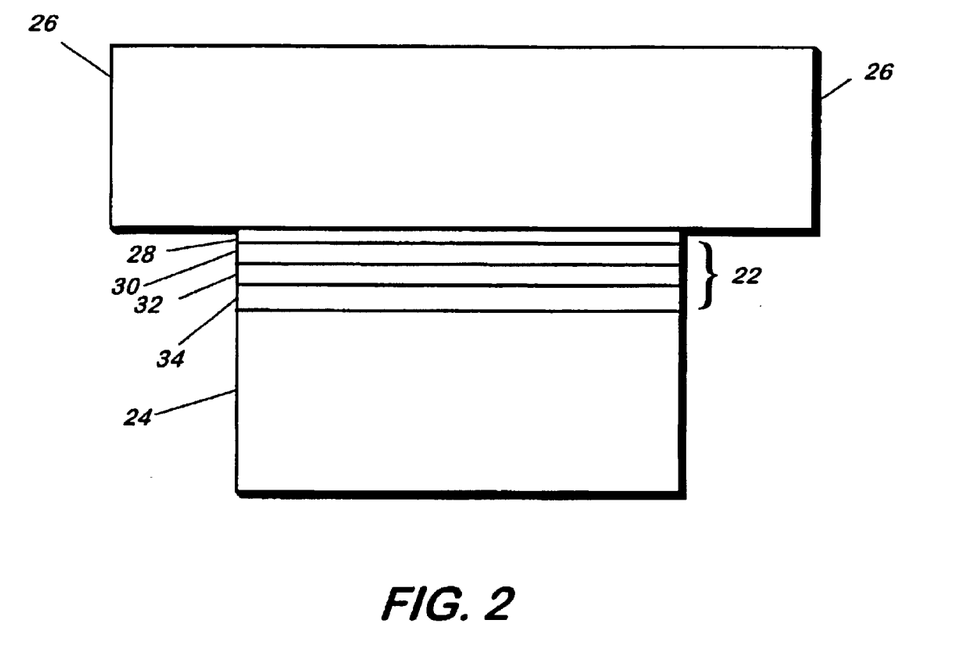
FIG. 2 is a cross-sectional view showing the laser cavity or the active region of a semiconducting laser in greater detail disposed on a semiconductor substrate and being in contact with a diamond heat sink above the laser cavity.
Figure 2A:
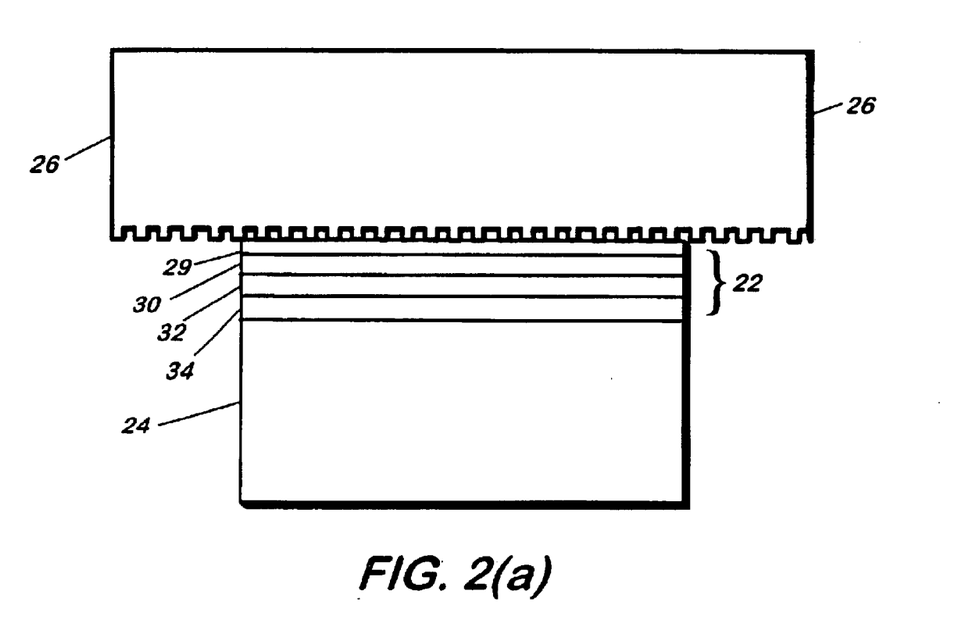

The heat source device is typically a semiconductor IR laser which has an active cavity disposed on a semiconducting substrate. FIG. 2 schematically illustrates a laser in greater detail. FIG. 2 illustrates an active cavity 22 of a laser disposed on a semiconducting substrate 24 with heat sink 26 disposed on laser cavity 22. The laser cavity 22 includes deposited sequentially by molecular beam epitaxy cap layer 28 disposed below and in contact with the heat sink 26, a top optical cladding 30 disposed below and in contact with cap layer 28, functional layer 32 disposed below and in contact with top cladding layer 30, and bottom optical cladding 34 disposed between the functional layer 32 and the substrate 24. The pressure bond in FIG. 2 is between heat sing 26 and cap layer 28.

The principal heat sink 26 (which is the counterpart of heat sink 12 in FIG. 1) is typically diamond but can by any other material with high thermal conductivity to quickly remove heat from a heat source. Other principal transparent heat sink materials include, but are not limited to, SiC, Si, sapphire, and GaP. The auxiliary heat sink blocks 14,16 (see FIG. 1) are typically copper but can be of any other suitable material.

In a particular embodiment, with the semiconductor substrate 24 being GaSb and the heat sink 26 being diamond, the cap layer 28 was GaSb about 150 Å thick; the top and bottom optical cladding 30, 34 were AlAs Sb about 3 $\mu$m thick; and the functional layer 32 was about 50 alternating layers of InAs, GaInSb, InAs, AlAsSb, with a total thickness of about 1 $\mu$m. With the heat sink being diamond, the transparent character of the diamond makes pumping of the lasers from above through the diamond possible as well as the pressure bond between the heat sink and the laser cavity.

The relationship of the components shown in FIG. 1 makes possible, due to the pressure bond between the heat sink and the laser cavity, a quick and efficient transfer of heat from laser cavity 22 to the principal heat sink 12 and then from the principal heat sink to metal blocks 14,16 which serve as auxiliary heat sinks.

Figure 3:
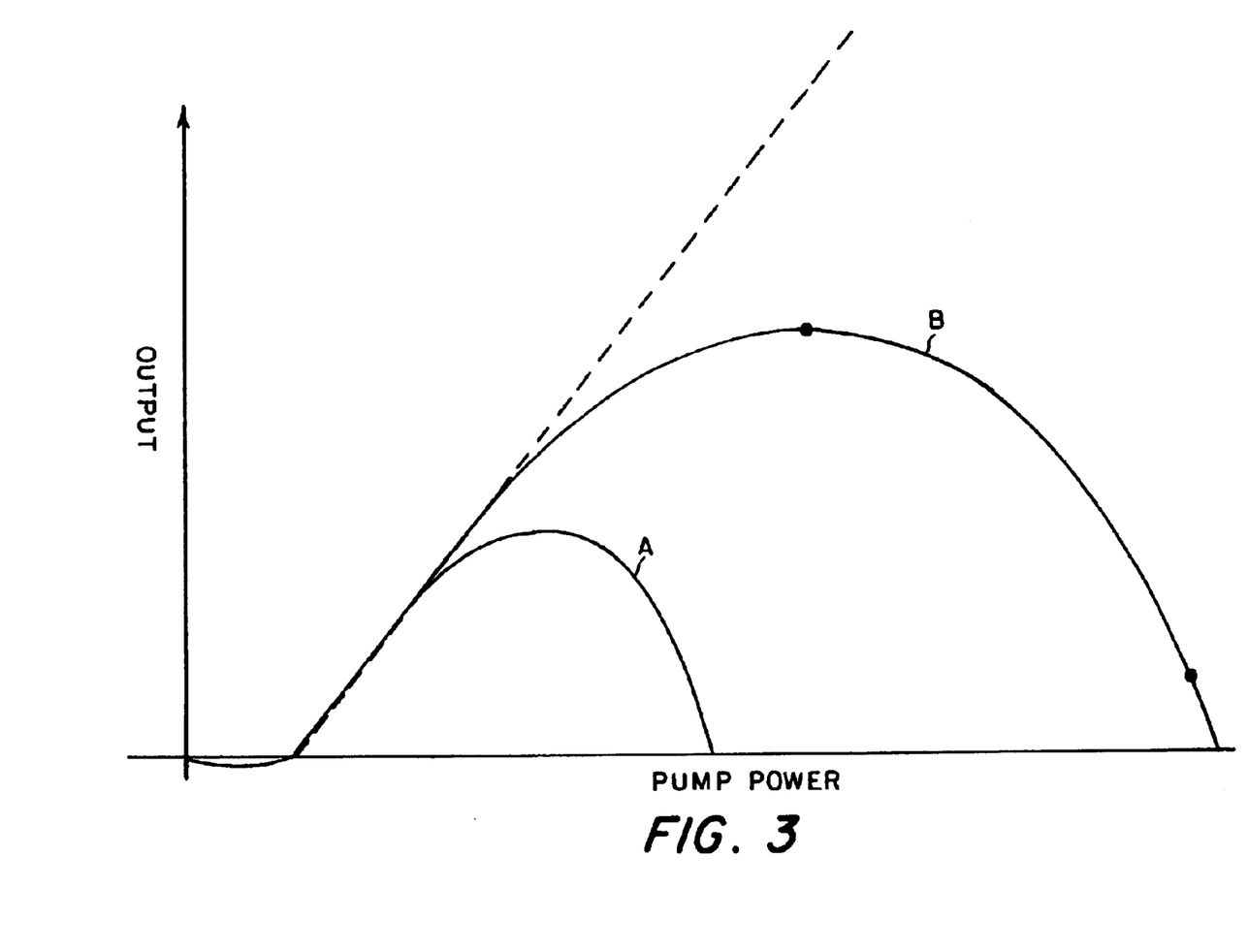
FIG. 3 is a graph of Output vs. Pump Power of a laser soldered to a copper heat sink, identified as "A", and that for the same laser pressure-bonded to a diamond heat sink, pursuant to this invention, identified as "B".

FIG. 3 is a graph of Output v. Pump Power at constant heat sink temperature and shows prior art operation "A" of a semiconductor laser characterized by a soldered copper block heat sink and operation "B", of the same laser but using a diamond heat sink pressure bond between the heat sink and the substrate, pursuant to this invention. Although the heat sink temperature is constant, the temperature of the functioning layer 32 is increasing withe pump power. For both prior art operation "A" and inventive operation "B", the temperature of the functional layer has reached the same maximum operating value for both modes at the termination point of the output. As should be apparent to one skilled in the art, on the basis of the FIG. 3 graph, operation of a semiconductor laser with the diamond heat sink pressure-bonded to a laser provides a choice of operating the laser at a higher output at a particular heat sink temperature, or at an elevated temperature where prior art operation would have ceased. Military applications would probably operate at higher output, which may require cryogenic cooling, whereas some commercial applications would probably operate at higher temperatures, i.e., approaching room temperature.

In terms of semiconductor lasers operating in the IR region, a prior art laser characterized by a soldered copper heat sink yielding 4 $\mu$m light, operates at a heat sink temperature of about −50° C. whereas the same laser pressure-bonded to a diamond heat sink, operates at about 2° C. This means that temperature of the heat sink is −50° C. in the prior art embodiment and 2° C. in the embodiment using the pressure bond. For a 3 $\mu$m laser, the respective temperatures are about −50° C. and about 17° C.

For optically-pumped semiconducting lasers, the interface surfaces are not rendered electrically conducting since there is no need to provide an electrical path. For electrically-pumped semiconducting lasers, the pressure bond is applied with a slight modification to the laser and the heat sink material. In the electrically-pumped lasers, the pressure bond must assure both good thermal contact and also provide an electrical path to the semiconductor device.

One approach, i.e., Approach I, of assuring electrical current to flow is to metallize the adjoining semiconductor and heat-sink surfaces. Unlike the bare semiconductor/heat sink bond discussed above, the bond for this configuration consists of a metal-metal interface. Assuming that the semiconductor and heat sink surfaces were smooth before metallization and that the metallizations are thin, the two metallized surfaces should also be quite smooth. In this context, smoothness is defined as being on the order of 50 Å rms. Thermal contact is again provided primarily by the application of pressure. This contrasts with the conventional epitaxial-side-up or epitaxial-side-down mounting arrangement in which the thermal contact relies on the solder bond between the two metallized surfaces. The conventional approach also requires processing at an elevated temperature to form the solder bond.

The metallization layer on both the semiconductor and heat sink surfaces can be up to several microns thick, although typically they on the order of 1 μm thick or less. The semiconductor metallization can be layers of titanium, platinum and gold, and may or may not be alloyed and can be deposited on the substrate by sputtering, thermal evaporation, e-beam evaporation or plating. The combination of metals and alloying is specific to the type of semiconductor. Typically, the heat sink metallization layers terminate in gold. The principal criteria for the metallization heat sink schemes are electrical conductivity and ruggedness.

In a second approach for electrical pumping, i.e., Approach II, a semiconductor substrate is used with a heavily n-doped or p-doped cap layer and is bonded to the heat sink which is also heavily doped near the surface or throughout its thickness. The pressure bond is then obtained as in the optical-pumping case, between the two doped materials, without any metallization of either surface. Under some conditions, it may be advantageous to strip off native oxide layers on one or both surfaces using an etchant of some other means, possibly followed by passivation in order to minimize potential barriers to the flow of current. Electrical current would then flow across the pressure-bonded interface from one material to the other.

In conjunction with Approach II, for a diamond heat sink, a boron dopant concentration can be $10^{19}$–$10^{20}$/cm$^3$. For other heat-sinking materials, both n-dopants and p-dopants are possible.

A third approach for electrical pumping, i.e., Approach III, would be to metallize one surface, either the semiconductor or the heat-sinking material, but not the other.

In addition to the basic pressure bond approach which has been described above, the invention also includes a number of more advanced configurations which are expected to lead to significant advantages over the current technology. These are based on configurations in which either the substrate or the heat sink or both are processed in some manner before the thermal bond is formed.

Figure 4:
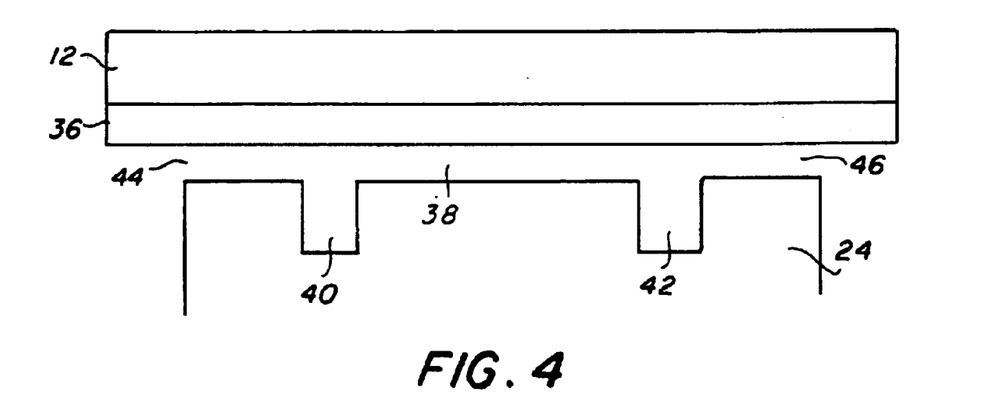
FIG. 4 is a cross-sectional view of an electrically pumped semiconductor laser where width of the laser cavity is defined by isolation trenches in the semiconductor.

One configuration is either an optically-pumped or electrically-pumped laser in which the active laser cavity is isolated from the laterally-adjacent semiconductor material through the etching of trenches in the semiconductor. A cross-sectional view of this configuration is illustrated schematically in FIG. 4 wherein heat sink 12 is metallized, as shown by reference numeral 36, and the substrate 24 is provided with metallization 38, with two spaced layers of dielectric 44,46 disposed on top surface of the substrate. Trenches 40,42 extend into the substrate a distance removed from outside edges of the substrate. Metallization layer 38 extends between inner edges of the trenches and the dielectric layers extend between outside edges of the trenches and the outside edges of the substrate. The dielectric and the metallization layers are planar and spaced whereas isolation trenches 40,42 extend from the upper surface of the substrate downward into the substrate. The etching may be done with either a wet or dry chemical process such as by reactive ion etching, and would be carried out before formation of the pressure bond. In this configuration, the lateral gain width of the laser is restricted to the mesa lying between the two isolation trenches. The trenches may both be left empty or filled with a dielectric passivant such as $SiO_2$ and planarized. For the electrical-pumping case of Approaches I or III, only the top of the active device is metallized, and the adjacent regions are coated with an equal thickness of a dielectric. For optical-pumping, no metallization or dielectric coatings are required and as before, there is a bare semiconductor/heat sink bond. In either case, the pressure bond will again be effective because it is applied between two broad, flat surfaces.

Figure 5:
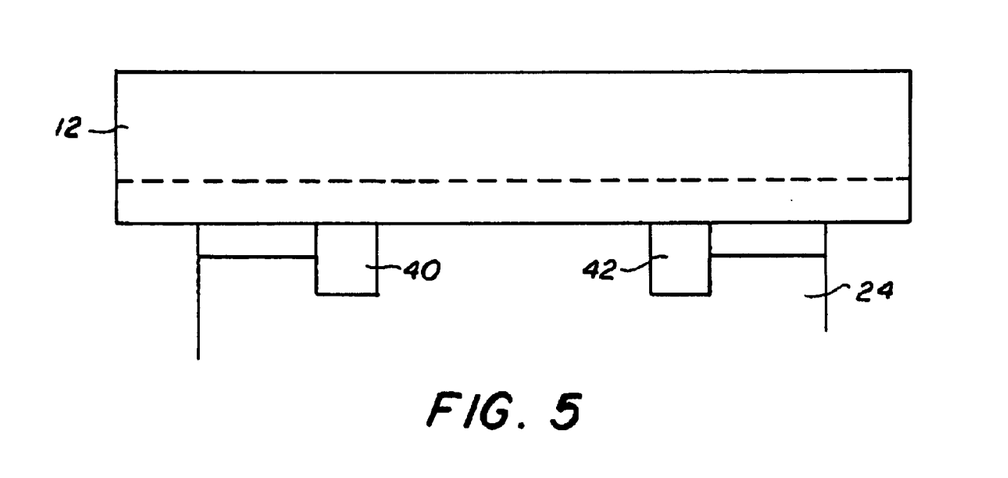
FIG. 5 is a cross-sectional view of an electrically pumped laser with a bare semiconductor/heat sink pressure-bonded together where the width of the laser cavity is defined by isolation trenches in the semiconductor substrate.

In a second configuration shown in FIG. 5, one obtains a bare semiconductor/heat sink pressure bond for the case of electrical pumping.

Figure 6:
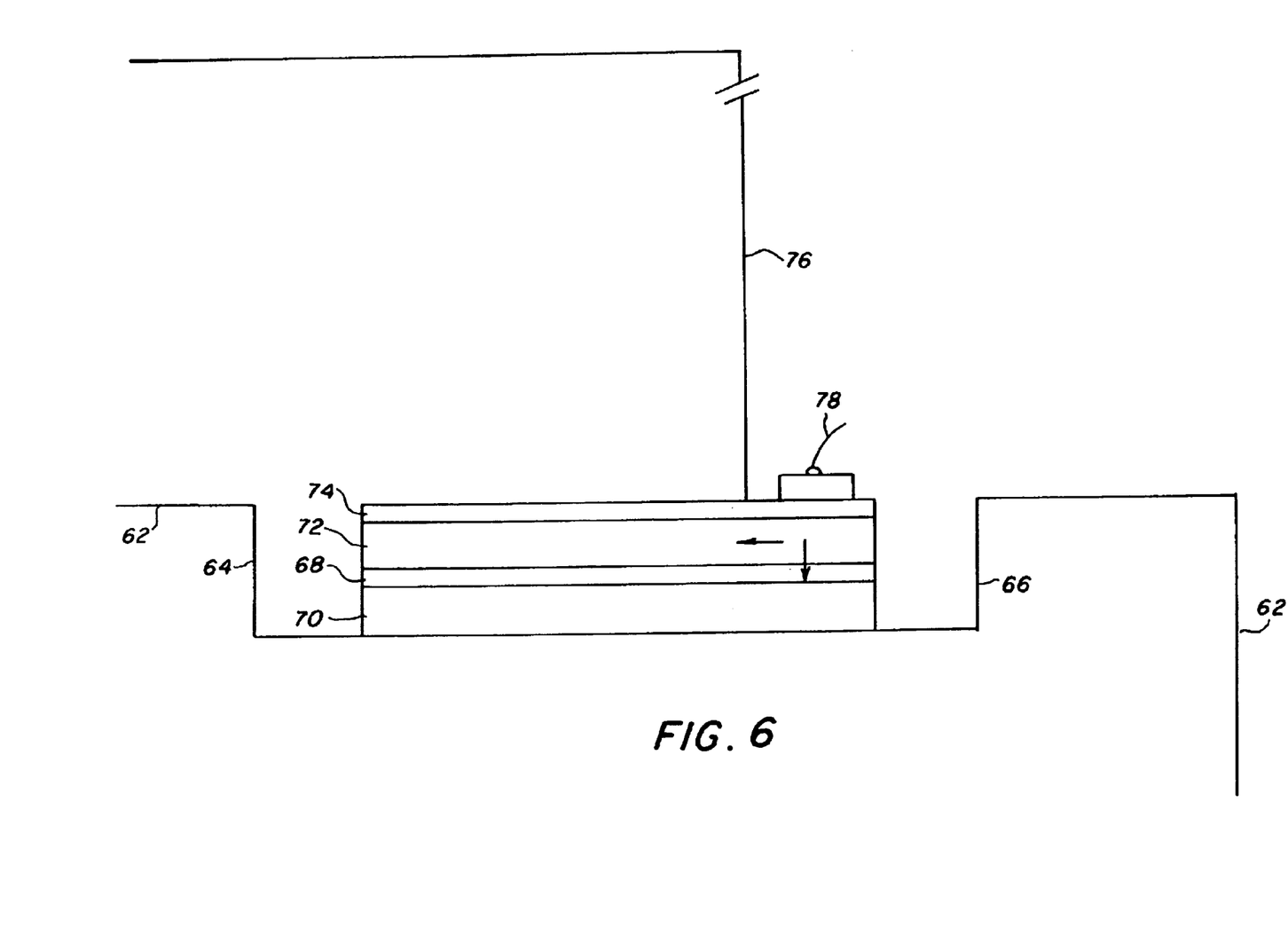
FIG. 6 is a cross-sectional view of an electrical contact beyond the edge of the heat sink, relying on current-spreading to make electrical pumping laterally uniform.

In FIG. 6, the metallized contact region lies just beyond the edge of the undoped diamond heat sink, and relies on current-spreading in a superlattice injection region to make the electrical pumping laterally-uniform. Superlattice injection layers can lead to current spreading over distances exceeding 100 um.

In FIG. 6 a cross-sectional view is shown of an electrically pumped semiconductor laser with a pair of spaced isolation trenches and an electrical contact beyond the edge of the heat sink. Substrate 62 has a pair of spaced trenches 64,66 defining the width of the laser active region 68 disposed between the trenches. Below and about the laser active region are upper and lower superlattice injection regions 70,72 which extend between the trenches and have a large lateral current-spreading component. Above the upper superlattice injection region 72 is metal layer 74 which extends between the trenches and forms a layer flush with the upper extent of the trenches and the upper surface of the substrate beyond or the left and right of the trenches, as shown in FIG. 6. Heat sink 76 is disposed and in contact with substrate 62 and its right edge is disposed over trench 64 but not over trench 66 but within or to the left of trench 66. Electrical contact 78 in disposed on the metal layer 74 outside of the heat sink 76. The pressure bond is between heat sink 76 and the top surface of the metal layer 74.

In a specific embodiment, substrate 62 was GaSb, the heat sink 76 was diamond; metal layer 74 was Ti/Pt/Au about 1 μm thick; the superlattice injection regions 70,72 were InAs/AlSb superlattices each 2–3 μm thick; and the laser active region 68 was on the order of 50 alternating layers of InAs, GaInSb, InAs and AlAsSb, with the active laser region 68 being about 1 μm thick.

Other configurations involve processing of the diamond or other heat-sinking material before the pressure bond is formed.

Figure 7:
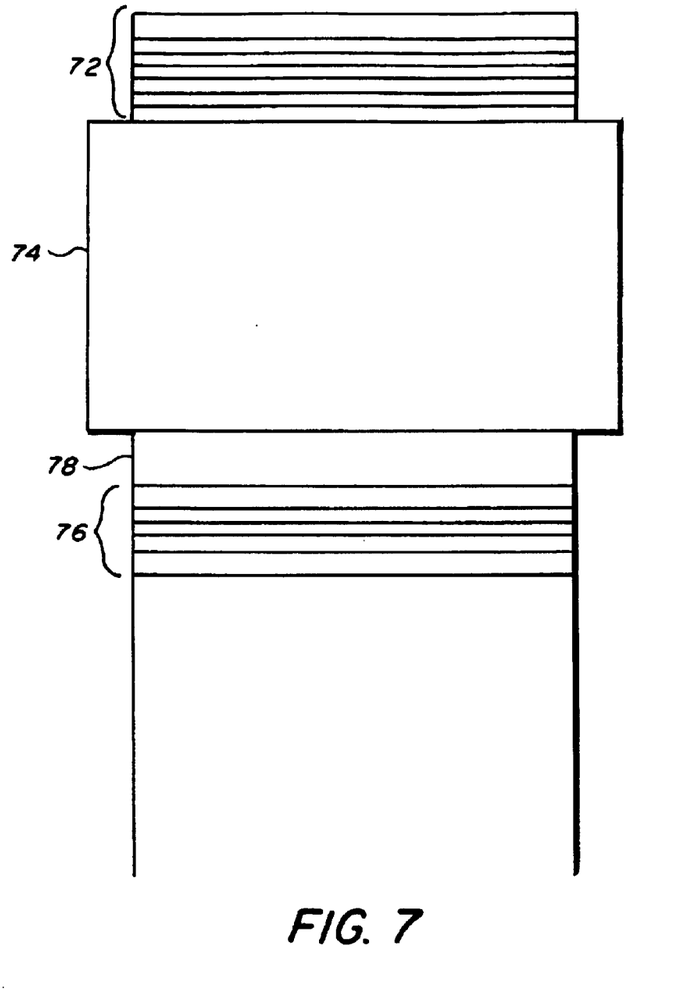
FIG. 7 is a cross-sectional view of a vertical-cavity surface-emitting laser in which the top mirror of the optical cavity consists of a dielectric stack and the bottom mirror of the optical cavity consists of a dielectric stack with the diamond heat sink disposed therebetween and the active laser disposed on the bottom mirror below the heat sink.

One such structure is a vertical-cavity surface-emitting laser (VCSEL), illustrated in FIG. 7, where the laser active region is pumped from above and the laser output is through the heat sink and the top mirror. In the FIG. 7 embodiment, the top mirror 72 consists of a dielectric stack or metal layer deposited on the top side of the diamond heat sink 74 opposite from the pressure bond side adjacent to the semiconductor.

In the preferred FIG. 7 configuration, the deposited top mirror has a reflectivity in the range 95–98% to allow extraction of the output beam. The preferred bottom mirror 76 is a Bragg reflector stack grown by MBE before the active region 78 is grown on top of the bottom mirror stack. The bottom mirror should have as high a reflectivity as possible, preferably $\geq 99\%$. For optical pumping, the pump beam also passes through the top mirror so that mirror should ideally be designed to have a high transmissivity at the pump wavelength. For electrical pumping, the bottom surface of the diamond adjacent to the semiconductor can be patterned with an annular metal ring and the semiconductor similarly patterned to form the top electrical contact for current flow. Again, the top mirror for the vertical cavity would be deposited on the top surface of the diamond heat sink.

Figure 8:
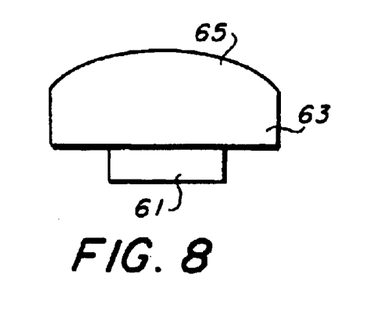
FIG. 8 is a schematic of an embodiment characterized by a pressure bond between a heat sink and a heat source device wherein the upper surface of the heat sink is convex.
Figure 9:
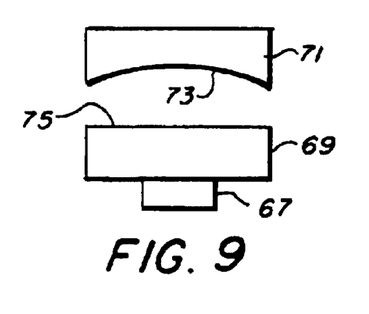
FIG. 9 is a schematic of an embodiment characterized by a pressure bond between a heat sink and a heat source device and a mirror having a concave structure facing the heat sink and disposed above the heat sink device.

It should be noted that since the optical cavity includes the entire thickness of the diamond in these arrangements, single longitudinal mode operation may not be possible. However, single mode operation may be regained if the diamond is shaped so that the top mirror is spherical or convex, as shown in FIG. 8, or where the top mirror is curved inwardly or concave, as shown in FIG. 9. In FIG. 8, active layer 61 is pressure bonded to a transparent heat sink 63 having a highly reflective convex surface 65 that can involve a reflective coating. In FIG. 9, active layer 67 is pressure bonded to a transparent heat sink 69 and disposed about 2 cm thereabove is top mirror 71 having highly reflective concave surface 73. An anti-reflective coating can advantageously be deposited on the top surface 75 of heat sink 69.

Another configuration is a distributed feedback (dfb) laser in which the spatial modulation of the refractive index results from a periodic series of notches that have been patterned in the diamond heat sink. Two sets of notches are patterned, lying near opposite ends of the cleaved laser cavity. As the optical mode travels along the laser cavity, it is subjected to a periodic variation of its net refractive index due to the alternate sensing of diamond and air above the semiconductor. If the period of the index modulation is equal to an integral number of half wavelengths near the peak of the gain spectrum, a single narrow wavelength is selected for lasing and the cavity becomes redefined as the region between the two mirrors near the opposite ends of the cleaved cavity. For electrical pumping, there may be notches in the diamond or alternatively, there may be notches only in the metallization on the semiconductor. This would lead to a spatial modulation of the injection current in addition to the direct modulation of the refractive index.

Another possible application exploits the high acoustic velocity of diamond and the intimate contact of the diamond with the semiconductor to modulate the laser. For this application, a piezo-electric structure, i.e., $LiNbO_3$, $LiTaO_3$, etc., is patterned on any of the available diamond surfaces and used to drive an acoustic wave in the laser. The laser could be modulated in this way at up to 3.5 Ghz.

Many advantages are realized by the use of the pressure bond disclosed herein. The pressure bond provides an excellent thermal bond in a configuration that is simple, requires minimal processing, and eliminates the conventional solder layers which can add thermal resistance to the path from the device to the heat sink. Since the pressure bond mounting does not require soldering to the heat sink as in all conventional methods, there is a reduction of the thermal stress resulting from the rigid solder bond when the device is thermally cycled. Soldering at elevated temperatures can degrade the semiconductor materials and laser facets, a process that is eliminated with the pressure bond. Also, for optically-pumped lasers, there is no requirement for metallization of either the heat sink or the substrate.

Another important advantage in terms of convenience is that the same diamond heat sink can be reused to heat sink many devices with only light cleaning between uses. A further advantage is that the diamond makes an excellent top cladding layer so that it is unnecessary to grow a thick top optical cladding as part of the semiconductor substrate. This can be especially beneficial at longer wavelengths for which a thick optical cladding is required.

The pressure-bonding technique also lifts the usual constraint on the epitaxial-side-down configuration that is induced by the wavelength dependent transparency range of the substrate material. As discussed herein, the laser may simply be pumped through the diamond heat sink which is transparent to virtually any pump wavelength of interest. It is the side-mounting of the diamond by clamping between the two copper blocks which allows the optical path through the diamond to be unobstructed. A further advantage for optical pumping is the much easier verification of the pressure bond, which is aided by visual inspection through the diamond whereas the metal solder-bond of a conventional heat sinking allows no such inspection. Observation of changes in the quality of the total internal reflection within the diamond heat sink in the region of the bond provides an excellent means for telling when bonding has occurred between the two surfaces.

For electrical pumping, the pressure bond again avoids soldering and elevated-temperature processing because the thermal and electrical contact between the two electrically conducting surfaces is achieved by pressure. The diamond is again reuseable as in the optical-pumping case, although in certain cases, the diamond may need to be metallized after a limited number of cycles because of gradual degradation of the thin metal layer.

The embodiment in which isolation trenches are etched in the semiconductor has the advantage that the mesa between the trenches rather than gain-guiding defines the active region. All advantages of the pressure bond mounting without the trenches are also applicable to this embodiment as well.

Advantages of the embodiment in FIG. 5, which shows a trenched substrate and doped mating surfaces include elimination of the requirement for metallization of the diamond and the improved thermal resistance, which is lowest for the bare semiconductor/heat sink pressure bond. An additional feature of this arrangement is that it minimizes the penetration of the optical mode into the metallized contact layer, which has high optical loss. That advantage can be quite important at longer wavelengths, especially beyond 10 $\mu$m, for which it may be impractical to grow a top optical cladding layer thick enough to prevent penetration of the optical mode into the contact layer.

For the vertical-cavity surface-emitting laser (VCSEL) embodiment in which the top mirror for the optical cavity is deposited on top of the diamond, the advantages include: the direct thermal contact between the semiconductor active region and the diamond provides the best possible heat sinking, better than any conventional VCSEL; the diamond with the deposited top mirror is reusable; and once the semiconductor wafer has been grown and the top mirror has been deposited onto the reusable diamond heat sink, no further processing of the VCSEL device is necessary apart from the mechanical formation of the pressure bond.

A primary advantage of the optically-pumped pressure bond of the embodiment with the notched grating in the diamond heat sink is that once the notched grating in the diamond heat sink has been fabricated, no device processing is required to make the index grating. Furthermore, the same piece of diamond can easily be reused for many devices and one can change the single mode wavelength of the same laser simply by transferring to a different piece of diamond with different notch period. Since the diamond heat sink can form an arbitrarily large portion of the top optical cladding layer, having only a thin semiconductor portion of the top optical clad in conjunction with the notched diamond can lead to a very large modulation of the reflective index for the mode.

The heat sink system includes a heat source device and a heat sink in contact with the heat source device, with a specific thermal resistance at the interface between the heat source device and the heat sink being typically less than about 5 K/kW-cm$^2$, typically about 3 K/kW-cm$^2$ or less. The system is characterized by the pressure between the heat sink and the heat source device. It is estimated that pressure is greater than the pressure for plastic deformation of an indium metal gasket when a suitable pressure bond is formed. The estimated pressure is on the order of 20 Mpa (600 lbs/in$^2$). Furthermore, when a diamond heat sink is in contact with a heat source device but a suitable pressure bond has not been formed, the interface between the heat sink and the heat source device will be shiny, due to light reflection at the diamond/air interface. However, the interface becomes dark or black when a suitable pressure bond is formed indicating that total internal reflection is no longer taking place.

The specific thermal resistance is a measurement of the rise in temperature of the functioning layer per unit amount of the rate at which heat deposited there, for a given configuration of the functioning layer with respect to the heat sink. The lower the value of thermal resistance, the higher the quantity of the heat sink bond. For the prior art heat sink method of epilayer-down soldering of semiconductor lasers to copper heat sinks, typical values of specific thermal resistance are 10 K/kW-cm$^2$, with a value 4 K/kW-cm$^2$ being regarded as state of the art. In the electrically pumped embodiment of Approach I, values as low as 3 K/kW-cm$^2$ have been measured. For optically pumped lasers, typical prior art values are 4 K/kW-cm$^2$ whereas the embodiment described herein can generate values as low as 1.5 K/kW-cm$^2$.

Cold welding is different from forming the pressure bond described herein. Cold welding is a process in which two materials bond together without the direct application of heat to the joint areas. Typically, both of the materials are metals, and some friction or other force is involved in creating the joint. Also, a cold weld bond is effectively permanent—force must be applied to break the materials apart, often damaging the original surfaces. One example of the use of cold welding involves flip-chip bonding, where a semiconductor with a patterned metallic layer is pressed against patterned electrodes and forms a semi-permanent attachment. This "cold weld" is actually between two metals, an not directly to a semiconducting or insulating material.

In creating a pressure bond, as described herein, a force is applied to press together a heat sink and a semiconductor. No friction or sonic energy is used. The bond is in no way permanent. When the pressure is removed, the materials separate, without any damage to either surface. The pressure bond may be made between materials that are not suitable for cold welding.

On some of the possible applications of the pressure bond, it was stated that the pressure bond method could be used for electrically pumped samples that would be coated with metal. In such a case, it is possible that a cold weld could form between the laser material and a metallized heat sing, but it would not be necessary for the device to function.

While presently preferred embodiments have been shown of the novel invention, and of the several modifications discussed, persons skilled in this art will readily appreciate that various additional changes and modifications may be made without departing from the spirit of the invention as defined and differentiated by the following claims.

What is claimed is:

1. A method for removing heat from a heat source device disposed on a substrate comprising the steps of placing one surface of a heat source device having surface smoothness on the order of 50 Å rms in contact with one surface of a heat sink having surface smoothness on the order of 50 Å rms without soldering the heat sink and the heat source device, contacting the heat sink with a cooling energy source, and applying a sufficient force to form a pressure bond between the heat source device and the heat sink wherein thermal resistance at the interface between the heat source device and the heat sink after the pressure bond is established is less than about 5 K/kw-cm$^2$, the heat source device having one and other surfaces.

2. The method of claim 1 including the step of providing a bottom mirror in contact with the other surface of the heat source device and the step of providing a top mirror in contact with the other surface of the heat sink.

3. The method of claim 1 including the step of providing a convex surface on the other surface of the heat sink.

4. The method of claim 1 including the step providing a mirror spaced above the heat sink, the mirror having a concave surface facing the heat sink.

5. The method of claim 1 wherein the heat source device is selected from the group consisting of optically pumped semiconductor lasers, electrically pumped semiconductor lasers, optical and electronic devices; and wherein the heat sink is a material selected from the group consisting of diamond, SiC, Si, sapphire, GaP, Cu, and mixtures thereof.

6. The method of claim 5 wherein the interface surfaces of the heat source device and the heat sink are electrically conducting.

7. The method of claim 6 wherein the electrically conducting interface surfaces of the heat source device and the heat sink are selected from the group consisting of metal layers deposited on the interface and doped regions of the interface surfaces to make them electrically conducting.

8. The method of claim 7 wherein the metal layers are deposited by the method selected from the group consisting of sputtering thermal evaporation, e-beam evaporation, and plating; and the metals are selected from the group consisting of copper, Sn, Ge, Ni, Ti, Pt, Au, Ag, InAl, V, Nb, Pb and mixtures and alloys thereof; and each doped region is doped with a dopant selected from the group consisting of n-dopants and p-dopants.

9. The method of claim 8 wherein at least one dopant is boron in the amount of $10^{19}$–$10^{20}$ boron atoms per cm$^3$.

10. The method of claim 1 wherein the heat source is a laser that emits light at a wavelength in the range of 3–5 μm, the maximum temperature at which the laser would lase is at least −30° C., and thermal resistance between the heat sink and the heat source is less than about 3 K/kw-cm$^2$.

11. The method of claim 10 including the step of patterning the heat sink surface at the interface.

12. The method of claim 11 wherein the substrate is selected from the group consisting of GaAs, InP, InAs, InSb, SiC, GaN, GaSb, sapphire, diamond, BaF$_2$, ZnSe, ZnTe, ZnS, SiGe, HgCdTe, and mixtures thereof.

13. The method of claim 11 wherein the heat source device is a semiconductor infrared laser, the heat sink is diamond and the substrate is GaSb.

14. The method of claim 13 wherein the method further includes the step of etching a pair of spaced trenches from the interface surface thereof in order to isolate the laser from laterally adjacent semiconductor material.

* * * * *